US008954914B2

(12) United States Patent
Badar et al.

(10) Patent No.: US 8,954,914 B2
(45) Date of Patent: Feb. 10, 2015

(54) GRAPHICAL METHOD AND PRODUCT TO ASSIGN PHYSICAL ATTRIBUTES TO ENTITIES IN A HIGH LEVEL DESCRIPTIVE LANGUAGE USED FOR VLSI CHIP DESIGN

(71) Applicant: International Business Machines Corporation, Armonk, NY (US)

(72) Inventors: John T. Badar, Austin, TX (US); David W. Lewis, Pleasant Valley, NY (US); Michael H. Wood, Hopewell Junction, NY (US); Matthew M. Ziegler, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/855,416

(22) Filed: Apr. 2, 2013

(65) Prior Publication Data
US 2014/0298278 A1 Oct. 2, 2014

(51) Int. Cl.
*G06F 17/50* (2006.01)
(52) U.S. Cl.
CPC .................. *G06F 17/505* (2013.01)
USPC ............ 716/132; 716/104; 716/119; 716/139
(58) Field of Classification Search
CPC ............ G06F 17/5072; G06F 17/5081; G06F 17/5022; G06F 2217/72; G06F 17/505
USPC .......................... 716/104, 118, 119
See application file for complete search history.

(56) References Cited

U.S. PATENT DOCUMENTS

| 6,470,482 | B1 | 10/2002 | Rostoker et al. | |
|---|---|---|---|---|
| 2009/0300570 | A1 | 12/2009 | Chan | |
| 2012/0054707 | A1* | 3/2012 | Goodman et al. | ............ 716/119 |
| 2012/0079442 | A1* | 3/2012 | Akar et al. | ..................... 716/112 |
| 2012/0144355 | A1 | 6/2012 | Dai et al. | |

OTHER PUBLICATIONS

U.S. Appl. No. 13/398,409, filed Feb. 16, 2012, Harry Barowski et al.
U.S. Appl. No. 13/484,111, filed May 30, 2012, Samuel I. Ward et al.
Xilinx, "Floorplanner Guide," Xilinx Development System, ver. 3.1i (2000).

* cited by examiner

*Primary Examiner* — Vuthe Siek
(74) *Attorney, Agent, or Firm* — Steven L. Bennett; Jack V. Musgrove

(57) ABSTRACT

A layout for an integrated circuit is designed by assigning physical design attributes including locations to a selected subset of placeable objects in the circuit netlist, prior to any physical synthesis. A layout abstract is displayed in a graphical user interface to allow the designer to visually inspect a layout abstract which shows the selected objects at their assigned locations. After making any desired modifications to the object locations, the location information can be formatted as a synthesis input file. Physical synthesis is then carried out while maintaining fixed locations for the selected objects according to the assigned locations. Physical design attributes can include coordinates and an orientation. The selected subset of placeable objects can constitute an identified datapath of the integrated circuit design.

23 Claims, 5 Drawing Sheets

GRAPHICAL METHOD AND PRODUCT TO ASSIGN PHYSICAL ATTRIBUTES TO ENTITIES IN A HIGH LEVEL DESCRIPTIVE LANGUAGE USED FOR VLSI CHIP DESIGN

BACKGROUND OF THE INVENTION

1. Field of the Invention

The present invention generally relates to the design of semiconductor chips and integrated circuits, and more particularly to a method of graphically assigning physical attributes to elements in a high-level descriptive language file such as VHDL.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high-level behavioral descriptions of an IC device, and translates this high-level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. FIG. 1 illustrates a simplified integrated circuit design process 10. Process 10 begins with a high-level descriptive language (HLDL) file such as VHDL 11 defining a logic structure for the circuit, a list of boundary assertions 12, and a boundary 13 for the layout. These inputs are provided to the physical synthesis tool which carries out the multiple concurrent optimizations 14 for the entities in the VHDL file subject to the boundary constraints. After synthesis, the circuit elements are interconnected (wired) using a routing tool 15, which then produces a final layout 16 for the mask generator.

SUMMARY OF THE INVENTION

The present invention is generally directed to a method of designing a layout for an integrated circuit by receiving a logic description in a high-level description language for the integrated circuit having a plurality of circuit objects interconnected to form a plurality of nets, identifying a plurality of placeable objects in the circuit description, assigning physical design attributes including locations to a selected subset of the placeable objects, visually displaying a layout abstract which shows the selected subset of the placeable objects at their assigned locations, and saving the circuit description with the assigned physical design attributes as a synthesis input file. The synthesis input file can then be used, along with the logic description, an input boundary, and input boundary timing assertions to carry out multiple concurrent optimizations for the circuit objects in a physical synthesis process for the integrated circuit, while maintaining fixed locations for the selected subset of placeable objects according to the assigned physical design attributes to generate a placement-optimized layout for the integrated circuit. The layout abstract can be an intermediate layout abstract and, after visually displaying the intermediate layout abstract, a modified location can be assigned to at least one of the placeable objects in the selected subset of placeable objects, and a modified layout abstract can be displayed which shows the selected subset of the placeable objects at their assigned locations including the at least one placeable object at the modified location. The layout abstract can be generated using a schematic abstract embodying a logical representation of the selected subset of the placeable objects. In the illustrative embodiment, the physical design attributes include, for each placeable object in the selected subset of placeable objects, one or more location coordinates and an orientation. The selected subset of placeable objects can constitute an identified datapath of the integrated circuit. The physical design attributes can be assigned in response to receiving user input data from a graphical user interface displayed on a display device of the computer system, the graphical user interface having a table allowing selection of the placeable objects and having one or more input fields to designate placement information for a selected placeable object in the table, wherein the layout abstract is displayed within the graphical user interface.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
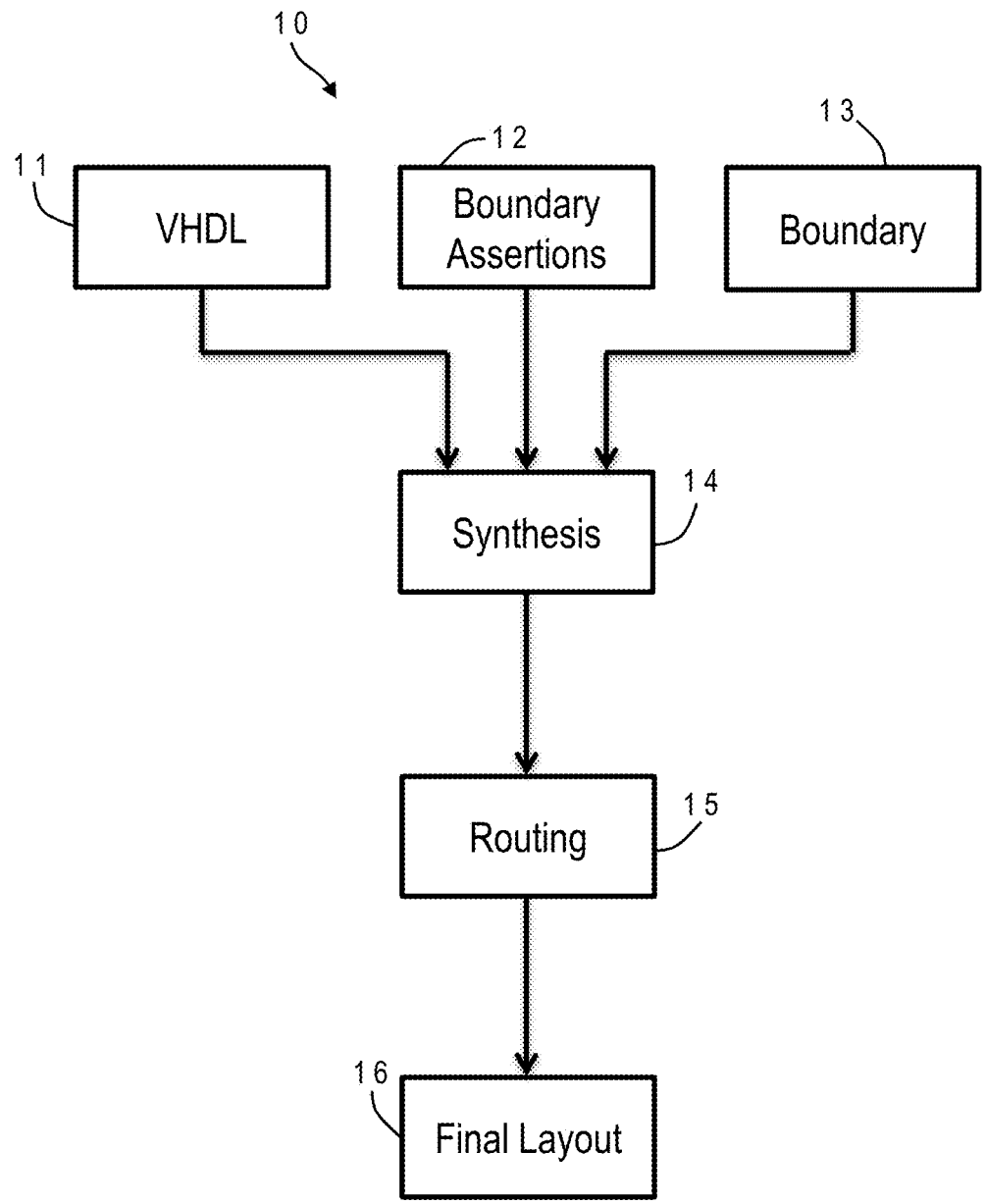
FIG. 1 is a chart illustrating the logical flow for a conventional integrated circuit design using physical synthesis.

State-of-the-art microprocessor circuits have become so complex that physical synthesis can take days to complete, and the computational requirements are increasing as designs are ever larger and more gates need to be placed. There are also more chances for bad placements due to limited area resources. A typical synthesis such as that seen in the process 10 of FIG. 1 does not always produce an optimal design. There is a large category of logical function types referred to as data flow (datapath) that synthesis struggles with, often producing suboptimal results. It would, therefore, be desirable to devise an improved method for circuit design which could increase circuit performance and design efficiency. It would be further advantageous if the method could reduce time to completion for physical synthesis.

The present invention achieves these advantages by supplying physical design attributes through a graphical method as additional inputs to the synthesis process. The ability to supply this information has not been available in prior art design tools. The graphical interface and technique of the present invention provides for the manipulation of physical placement data to enhance and improve the physical design results. An abstract representation of the physical instance is created to provide the user with the ability to manipulate and visualize the design data prior to actual physical design implementation, so as to control the characteristics of final design. The results of the graphical data manipulation can then be supplied to synthesis as another input for processing.

Figure 2:
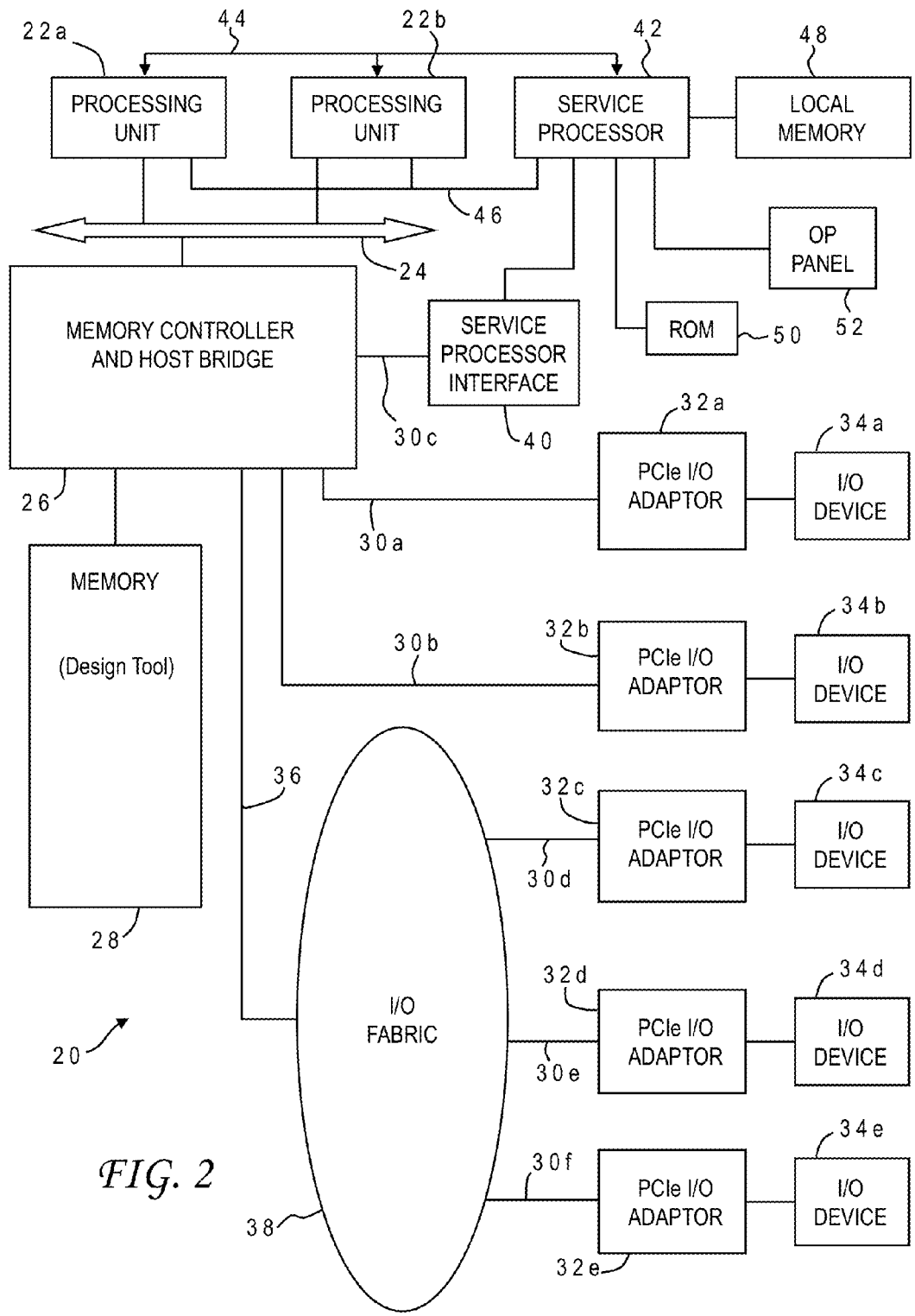
FIG. 2 is a block diagram of a computer system programmed to carry out integrated circuit design in accordance with one implementation of the present invention.

With reference now to the figures, and in particular with reference to FIG. 2, there is depicted one embodiment 20 of a computer system in which the present invention may be implemented to carry out the design of logic structures in an integrated circuit. Computer system 20 is a symmetric multiprocessor (SMP) system having a plurality of processors 22a, 22b connected to a system bus 24. System bus 24 is further connected to a combined memory controller/host bridge (MC/HB) 26 which provides an interface to system memory 28. System memory 28 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 26 also has an interface to peripheral component interconnect (PCI) Express links 30a, 30b, 30c. Each PCI Express (PCIe) link 30a, 30b is connected to a respective PCIe adaptor 32a, 32b, and each PCIe adaptor 32a, 32b is connected to a respective input/output (I/O) device 34a, 34b. MC/HB 26 may additionally have an interface to an I/O bus 36 which is connected to a switch (I/O fabric) 38. Switch 38 provides a fan-out for the I/O bus to a plurality of PCI links 30d, 30e, 30f. These PCI links are connected to more PCIe adaptors 32c, 32d, 32e which in turn support more I/O devices 34c, 34d, 34e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 26 provides a low latency path through which processors 22a, 22b may access PCI devices mapped anywhere within bus memory or I/O address spaces. MC/HB 26 further provides a high bandwidth path to allow the PCI devices to access memory 28. Switch 38 may provide peer-to-peer communications between different endpoints and this data traffic does not need to be forwarded to MC/HB 26 if it does not involve cache-coherent memory transfers. Switch 38 is shown as a separate logical component but it could be integrated into MC/HB 26.

In this embodiment, PCI link 30c connects MC/HB 26 to a service processor interface 40 to allow communications between I/O device 34a and a service processor 42. Service processor 42 is connected to processors 22a, 22b via a JTAG interface 44, and uses an attention line 46 which interrupts the operation of processors 22a, 22b. Service processor 42 may have its own local memory 48, and is connected to read-only memory (ROM) 50 which stores various program instructions for system startup. Service processor 42 may also have access to a hardware operator panel 52 to provide system status and diagnostic information.

In alternative embodiments computer system 20 may include modifications of these hardware components or their interconnections, or additional components, so the depicted example should not be construed as implying any architectural limitations with respect to the present invention. The invention may further be implemented in an equivalent cloud computing network.

When computer system 20 is initially powered up, service processor 42 uses JTAG interface 44 to interrogate the system (host) processors 22a, 22b and MC/HB 26. After completing the interrogation, service processor 42 acquires an inventory and topology for computer system 20. Service processor 42 then executes various tests such as built-in-self-tests (BISTs), basic assurance tests (BATs), and memory tests on the components of computer system 20. Any error information for failures detected during the testing is reported by service processor 42 to operator panel 52. If a valid configuration of system resources is still possible after taking out any components found to be faulty during the testing then computer system 20 is allowed to proceed. Executable code is loaded into memory 28 and service processor 42 releases host processors 22a, 22b for execution of the program code, e.g., an operating system (OS) which is used to launch applications and in particular the circuit design application of the present invention, results of which may be stored in a hard disk drive of the system (an I/O device 34). While host processors 22a, 22b are executing program code, service processor 42 may enter a mode of monitoring and reporting any operating parameters or errors, such as the cooling fan speed and operation, thermal sensors, power supply regulators, and recoverable and non-recoverable errors reported by any of processors 22a, 22b, memory 28, and MC/HB 26. Service processor 42 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such computer-readable storage media excludes transitory media such as propagating signals.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 20 carries out program instructions for a circuit design process that uses novel graphic techniques to manage physical attributes of entities in the semiconductor design. Accordingly, a program embodying the invention may include conventional aspects of various design tools, and these details will become apparent to those skilled in the art upon reference to this disclosure.

Figure 3:
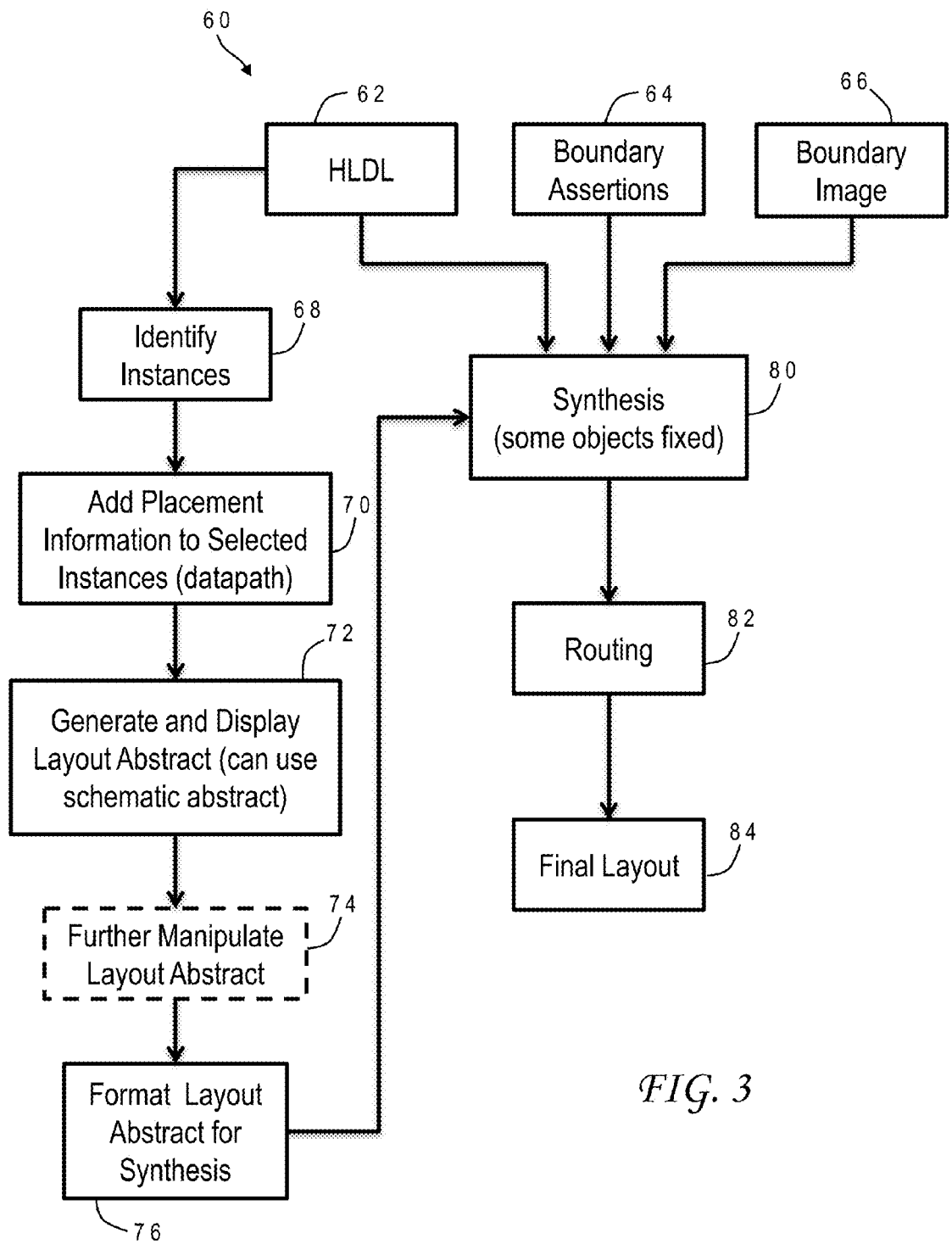
FIG. 3 is a chart illustrating the logical flow for an integrated circuit design process in accordance with one implementation of the present invention which provides for graphic manipulation of physical attributes of entities in the design.

Referring now to FIG. 3, there is depicted a chart illustrating the logical flow for an integrated circuit design process 60 in accordance with one implementation of the present invention which provides for graphic manipulation of physical attributes of entities in the design. Process 60 can be carried out using computer system 20, and begins with a high-level descriptive language (HLDL) file 62 such as VHDL defining a logic structure for the circuit, a list of boundary assertions 64 (timing constraints for logical inputs and outputs), and a physical boundary description 13 for the final design to be contained within. Process 60 includes a method to visually manipulate instance place records or attributes in VLSI circuits starting with the same HLDL format. This approach enables the designer to manage and control the placement records prior to synthesis to provide for optimal results with confidence of success. HLDL file is decoded directly to a user interface which can be immediately processed by the designer to identify instances 68 or any other entity (macro, IP block, memory, circuit structure, gate, etc.) whose placement the designer may want to control. These are placeable objects that the tool will recognize as unique instantiations to be manipulated during synthesis. The designer adds placement information 70 for the instances as desired. In an illustrative implementation, the subset of objects selected by the designer constitute a datapath of the integrated circuit design (a plurality of interconnected components that are used to transmit or generate a functional data signal of the circuit as opposed to, e.g., a clock signal). The datapath can be manually identified, or automated techniques can be used to highlight the datapath, such as that taught in U.S. patent application Ser. No. 13/484,111, which is hereby incorporated.

The placement information may for example include location information including one or more sets of coordinates and an orientation (e.g., vertical or horizontal in a Cartesian layout). The coordinates may be relative to the boundary input, or relative to a larger layout. The orientation is based on the aspect ratio of the object, i.e., the object has a length which is greater than its width and the orientation corresponds to the length direction. The placement information can be entered using numeric fields or selectable interactive objects of the user interface for the tool running on the computer system, or can be entered graphically through the user interface using a mouse or other pointing device (e.g., touch screen) such as in a drag-and-drop procedure wherein circuit elements of a design are listed in a table or depicted as icons.

Computer system 20 generates a layout abstract based on the placement information and displays the layout abstract 72 as a graphical image on a display device of computer system 20 for visual inspection by the designer. The circuit elements selected for placement are located within the boundary according to the assigned physical information. This image can be used to verify satisfactory placement of the selected subset of circuit elements, or to further fine tune the location data if desired. A schematic abstract may be used to create the layout abstract. The schematic abstract is basically a list of the selected objects with their corresponding physical information, embodying a logical representation of the elements selected for placement. The schematic abstract may also be displayed for designer reference. In the illustrative embodiment the schematic and layout abstract are not the full design, they represent only the elements in the HLDL file that have been assigned location information. By way of example and without implying any specific limitations, the design might include 1000 placeable objects but only 50 of them have been selected to assign physical information.

The designer may further manipulate the layout abstract 74 by adding more placement information (for additional entities) or by changing information previously entered. The changes can again be made using various numeric fields or interactive objects, or the depicted layout abstract can be used for graphical (mouse) operations such as drag-and-drop, flip, rotate, or otherwise move elements to fine tune or adjust the placement information. The modified layout abstract is then re-displayed for inspection. These steps may be repeated as the designer inspects automatically generated intermediate views of the schematic abstract and layout abstract.

Once the designer is satisfied with the visual presentation of the layout abstract, computer system 20 can format the layout abstract for synthesis 76. This formatting creates a new input file for synthesis which is compatible with the particular formatting requirements of the synthesis tool, apprising the tool that it should use the fixed physical information for the selected objects. All of the location/placement information for synthesis is thus acquired from the layout abstract. The formatted data can be saved and stored in the memory hierarchy of computer system 20 for a synthesis process to be carried out at a later time, or can be immediately used. This new input file is provided along with the original HLDL file 62, the boundary assertions 64, and the boundary image 66 for synthesis 80. Some entities in the HLDL file may not have the physical information, i.e., they will still be placeable/moveable by the synthesis tool. The synthesis tool then applies optimization algorithms which are generally conventional except having been modified to be constrained by the physical information assigned by the designer. The result is a dramatic improvement in performance of the logic functions of the circuit as well as a faster technique for implementing final design closure. The output of synthesis is a placed and optimized layout for the circuit that is further processed through an auto routing tool 82 used to generate the interconnects between the elements according to the netlist. The final product is a complete, optimized layout 84 embodying the logical network based on the original high level description language file.

Figure 4A:
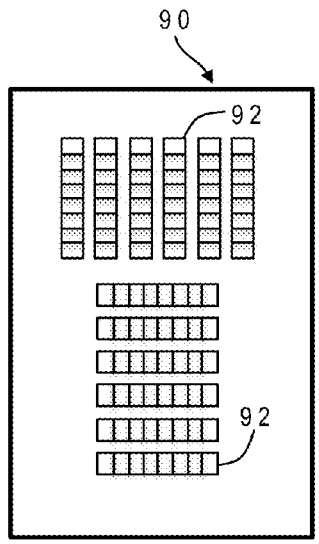
FIGS. 4A, 4B, and 4C are layout abstracts for an exemplary circuit design which is to be synthesized showing graphic manipulation in accordance with one implementation of the present invention.
Figure 4B:
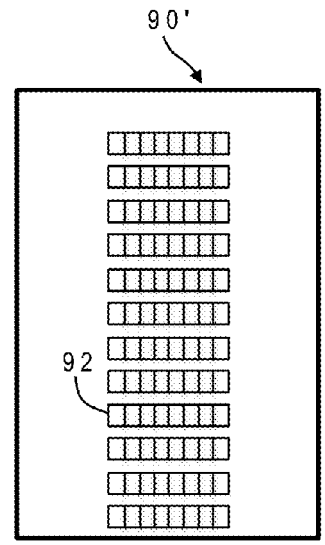
Figure 4C:
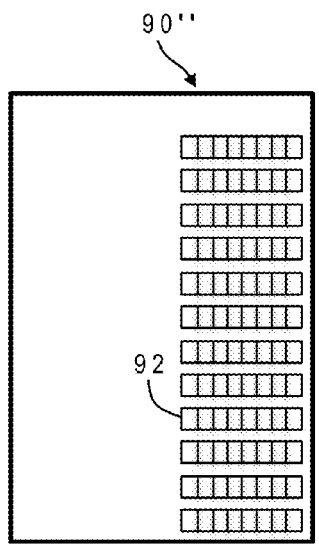

FIGS. 4A-4C illustrate an example of layout abstracts 90, 90', 90" for an integrated circuit design. In FIG. 4A, the designer has entered placement information for a plurality of circuit elements 92 thinking that it might be beneficial to place some of the circuit elements in a vertical orientation and some in a horizontal orientation, with all of the selected circuit elements being generally centered within the input boundary. After visually inspecting layout abstract 90 and realizing that there is adequate space for all of the selected circuit elements to be oriented horizontally to form a vertical stack, the designer has moved the six vertically-disposed elements that were at the top of layout abstract 90 and rearranged them in alignment with the six elements that were already horizontally disposed to form a vertical stack in an intermediate layout abstract 90'. The resulting stack has also been slightly moved downward toward the bottom edge of the layout boundary. After further visual consideration of layout abstract 90', the designer decides it would be better if these elements were all pushed against one of the side boundaries of the layout, so the entire vertical stack has been moved to the right side in the final layout abstract 90".

Figure 5:
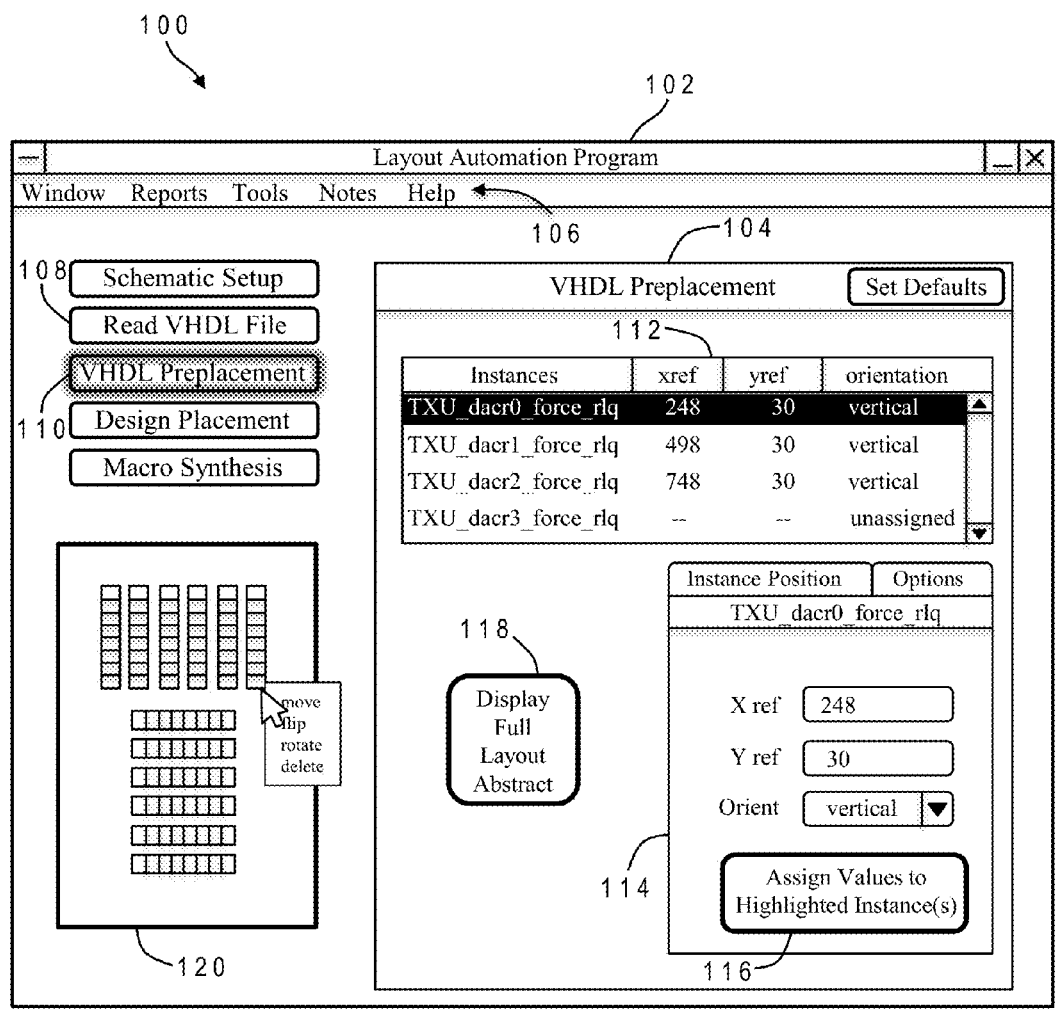
FIG. 5 is a graphical user interface for an integrated circuit design software application in accordance with one implementation of the present invention which allows the designer to assign specific coordinates and orientations of circuit entities.

The present invention may be further understood with reference to FIG. 5 which shows one embodiment of a graphical user interface 100 constructed in accordance with the present invention for receiving user input data related to physical attributes of the circuit entities. User interface 100 includes one or more windows including a parent window 102 which is entitled "Layout Automation Program" and a child window 104 contained within parent window 102 which is entitled "VHDL Preplacement". Parent window 102 may include conventional features accessible by a menu bar 106 having menu commands entitled "Window", "Reports", "Tools", "Notes", and "Help". Parent window 102 further includes a plurality of interactive objects such as buttons which can be used to activate certain features. For example, one of these buttons 108 is labeled "Read VHDL File" and is used to allow the designer to enter the name of the HLDL source file stored on computer system 20 or on a connected network that is to form the basis of the circuit layout (i.e., box 62 in FIG. 3). Another button 110 is labeled "VHDL Preplacement" and is used to bring up child window 104 which allows the designer to enter the desired placement information.

Child window 104 includes a table 112 which lists all of the instances found in the VHDL netlist. The designer can select one or more lines of table 112 using the mouse or other pointing device, which results in the selected line(s) being visually highlighted in the user interface. Child window 106 also includes a dialog box 114 which contains one or more fields for the physical information to be assigned to the selected instance(s). In this embodiment dialog box 114 includes an "X ref" numeric (integer) field to enter the x-coordinate for a particular corner (e.g., lower left corner) of the object to be placed, a "Y ref" numeric (integer) field to enter the y-coordinate for the corner of the object, an "Orient" drop-down menu which allows the user to select between vertical and horizontal orientations, and a button 116 labeled "Assign Values to Highlighted Instances". When the designer clicks on button 116, the coordinates and orientation currently set in dialog box 114 are applied (assigned) to the selected instance(s) in table 112. Another button 118 of child window 104 can be used to display a layout abstract 120 based on the assigned physical information. In this embodiment layout abstract 120 is shown as part of parent window 102.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while placement information has been described in the context of a planar Cartesian system (x- and y-coordinates, and vertical/horizontal orientations), the system could instead refer to polar coordinates and orientations, or to a three-dimensional layout. Also, once the capability to add placement information is introduced, then adding other information is also possible, e.g., size. It is therefore contemplated that such modifications can be made without departing from the spirit or scope of the present invention as defined in the appended claims.

What is claimed is:

1. A method of designing a layout for an integrated circuit comprising:
   receiving a logic description in a high-level description language for the integrated circuit, the logic description having a plurality of circuit objects interconnected to form a plurality of nets, by executing first instructions in a computer system;
   identifying a plurality of placeable objects in the circuit description, by executing second instructions in the computer system;
   assigning physical design attributes including locations to a selected subset of the placeable objects, by executing third instructions in the computer system;
   visually displaying a layout abstract which shows the selected subset of the placeable objects at their assigned locations, by executing fourth instructions in the computer system;
   saving the circuit description with the assigned physical design attributes as a synthesis input file, by executing fifth instructions in the computer system;
   carrying out multiple concurrent optimizations for the circuit objects in a physical synthesis process for the integrated circuit using the synthesis input file, the logic description in the high-level description language, an input boundary, and input boundary timing assertions while maintaining fixed locations for the selected subset of placeable objects according to the assigned physical design attributes to generate a placement-optimized layout for the integrated circuit, by executing sixth instructions in the computer system; and
   routing interconnections between the circuit objects in the placement-optimized layout according to the logic description to generate a final layout for the integrated circuit, by executing seventh instructions in the computer system.

2. The method of claim 1 wherein the layout abstract is an intermediate layout abstract and, after said visually displaying the intermediate layout abstract, further comprising:
   assigning a modified location to at least one of the placeable objects in the selected subset of placeable objects; and
   visually displaying a modified layout abstract which shows the selected subset of the placeable objects at their assigned locations including the at least one placeable object at the modified location.

3. The method of claim 1 wherein the layout abstract is generated using a schematic abstract embodying a logical representation of the selected subset of the placeable objects.

4. The method of claim 1 wherein the physical design attributes include, for each placeable object in the selected subset of placeable objects, one or more location coordinates and an orientation.

5. The method of claim 1 wherein the selected subset of placeable objects constitutes an identified datapath of the integrated circuit.

6. The method of claim 1 wherein said saving is performed in response to receiving a user command indicating that the layout abstract as displayed is acceptable.

7. The method of claim 1 wherein the physical design attributes are assigned in response to receiving user input data from a graphical user interface displayed on a display device of the computer system, the graphical user interface having a table allowing selection of the placeable objects and having one or more input fields to designate placement information for a selected placeable object in the table, wherein the layout abstract is displayed within the graphical user interface.

8. A computer system comprising:
   one or more processors which process program instructions;
   a memory device connected to said one or more processors; and
   program instructions residing in said memory device for designing a layout of an integrated circuit by receiving a logic description in a high-level description language for the integrated circuit having a plurality of circuit objects interconnected to form a plurality of nets, identifying a plurality of placeable objects in the circuit description, assigning physical design attributes including locations to a selected subset of the placeable objects, visually displaying a layout abstract which shows the selected subset of the placeable objects at their assigned locations, and saving the circuit description with the assigned physical design attributes as a synthesis input file, wherein said program instructions further carry out multiple concurrent optimizations for the circuit objects in a physical synthesis process for the integrated circuit using the synthesis input file, the logic description in the high-level description language, an input boundary, and input boundary timing assertions while maintaining fixed locations for the selected subset of placeable objects according to the assigned physical design attributes to generate a placement-optimized layout for the integrated circuit, and route interconnections between the circuit objects in the placement-optimized layout according to the logic description to generate a final layout for the integrated circuit.

9. The computer system of claim 8 wherein the layout abstract is an intermediate layout abstract and, after visually displaying the intermediate layout abstract, said program instructions further assign a modified location to at least one of the placeable objects in the selected subset of placeable objects, and visually display a modified layout abstract which shows the selected subset of the placeable objects at their assigned locations including the at least one placeable object at the modified location.

10. The computer system of claim 8 wherein the layout abstract is generated using a schematic abstract embodying a logical representation of the selected subset of the placeable objects.

11. The computer system of claim 8 wherein the physical design attributes include, for each placeable object in the selected subset of placeable objects, one or more location coordinates and an orientation.

12. The computer system of claim 8 wherein the selected subset of placeable objects constitutes an identified datapath of the integrated circuit.

13. The computer system of claim 8 wherein said saving is performed in response to receiving a user command indicating that the layout abstract as displayed is acceptable.

14. The computer system of claim 8 wherein the physical design attributes are assigned in response to receiving user input data from a graphical user interface displayed on a display device of the computer system, the graphical user interface having a table allowing selection of the placeable objects and having one or more input fields to designate placement information for a selected placeable object in the table, wherein the layout abstract is displayed within the graphical user interface.

15. A computer program product comprising:
a computer-readable storage medium; and
program instructions residing in said storage medium for designing a layout of an integrated circuit by receiving a logic description in a high-level description language for the integrated circuit having a plurality of circuit objects interconnected to form a plurality of nets, identifying a plurality of placeable objects in the circuit description, assigning physical design attributes including locations to a selected subset of the placeable objects, visually displaying a layout abstract which shows the selected subset of the placeable objects at their assigned locations, and saving the circuit description with the assigned physical design attributes as a synthesis input file, wherein said program instructions further carry out multiple concurrent optimizations for the circuit objects in a physical synthesis process for the integrated circuit using the synthesis input file, the logic description in the high-level description language, an input boundary, and input boundary timing assertions while maintaining fixed locations for the selected subset of placeable objects according to the assigned physical design attributes to generate a placement-optimized layout for the integrated circuit, and route interconnections between the circuit objects in the placement-optimized layout according to the logic description to generate a final layout for the integrated circuit.

16. The computer program product of claim 15 wherein the layout abstract is an intermediate layout abstract and, after visually displaying the intermediate layout abstract, said program instructions further assign a modified location to at least one of the placeable objects in the selected subset of placeable objects, and visually display a modified layout abstract which shows the selected subset of the placeable objects at their assigned locations including the at least one placeable object at the modified location.

17. The computer program product of claim 15 wherein the layout abstract is generated using a schematic abstract embodying a logical representation of the selected subset of the placeable objects.

18. The computer program product of claim 15 wherein the physical design attributes include, for each placeable object in the selected subset of placeable objects, one or more location coordinates and an orientation.

19. The computer program product of claim 15 wherein the selected subset of placeable objects constitutes an identified datapath of the integrated circuit.

20. The computer program product of claim 15 wherein said saving is performed in response to receiving a user command indicating that the layout abstract as displayed is acceptable.

21. The computer program product of claim 15 wherein the physical design attributes are assigned in response to receiving user input data from a graphical user interface displayed on a display device of the computer system, the graphical user interface having a table allowing selection of the placeable objects and having one or more input fields to designate placement information for a selected placeable object in the table, wherein the layout abstract is displayed within the graphical user interface.

22. A method of designing a layout for an integrated circuit comprising:
first receiving a logic description in a high-level description language for the integrated circuit, the logic description having a plurality of circuit objects interconnected to form a plurality of nets, by executing first instructions in a computer system;
identifying a plurality of placeable objects in the circuit description, by executing second instructions in the computer system;
first assigning physical design attributes including locations to a selected subset of the placeable objects wherein the physical design attributes include, for each placeable object in the selected subset of placeable objects, one or more location coordinates and an orientation, and the selected subset of placeable objects constitutes an identified datapath of the integrated circuit, by executing third instructions in the computer system;
first visually displaying an intermediate layout abstract which shows the selected subset of the placeable objects at their assigned locations, by executing fourth instructions in the computer system;

second assigning a modified location to at least one of the placeable objects in the selected subset of placeable objects, by executing fifth instructions in the computer system;

second visually displaying a modified layout abstract which shows the selected subset of the placeable objects at their assigned locations including the at least one placeable object at the modified location, by executing sixth instructions in the computer system;

second receiving a user command indicating that the modified layout abstract as displayed is acceptable, by executing seventh instructions in the computer system;

responsive to said second receiving, saving the circuit description with the assigned physical design attributes as a synthesis input file, by executing eighth instructions in the computer system;

carrying out multiple concurrent optimizations for the circuit objects in a physical synthesis process for the integrated circuit using the synthesis input file, the logic description in the high-level description language, an input boundary, and input boundary timing assertions while maintaining fixed locations for the selected subset of placeable objects according to the assigned physical design attributes to generate a placement-optimized layout for the integrated circuit, by executing ninth instructions in the computer system; and routing interconnections between the circuit objects in the placement-optimized layout according to the logic description to generate a final layout for the integrated circuit, by executing tenth instructions in the computer system.

23. A method of designing a layout for an integrated circuit comprising:

receiving a logic description in a high-level description language for the integrated circuit, the logic description having a plurality of circuit objects interconnected to form a plurality of nets, by executing first instructions in a computer system;

identifying a plurality of placeable objects in the circuit description, by executing second instructions in the computer system;

assigning physical design attributes including locations to a selected subset of the placeable objects in response to receiving user input data from a graphical user interface displayed on a display device of the computer system, by executing third instructions in the computer system, the graphical user interface having a table allowing selection of the placeable objects and having a dialog box with one or more input fields to designate placement information for a selected placeable object in the table;

visually displaying a layout abstract within the graphical user interface which shows the selected subset of the placeable objects at their assigned locations, by executing fourth instructions in the computer system; and saving the circuit description with the assigned physical design attributes as a synthesis input file, by executing fifth instructions in the computer system.

* * * * *